United States Patent
Chindo et al.

(10) Patent No.: US 8,564,376 B2
(45) Date of Patent: *Oct. 22, 2013

(54) PHYSICAL SECTION OF ATOMIC OSCILLATOR

(75) Inventors: Koji Chindo, Kawasaki (JP); Taku Aoyama, Setegaya (JP)

(73) Assignee: Seiko Epson Corporation (JP)

( * ) Notice: Subject to any disclaimer, the term of this patent is extended or adjusted under 35 U.S.C. 154(b) by 186 days.

This patent is subject to a terminal disclaimer.

(21) Appl. No.: 13/178,086

(22) Filed: Jul. 7, 2011

(65) Prior Publication Data

US 2011/0260801 A1    Oct. 27, 2011

Related U.S. Application Data

(63) Continuation of application No. 12/607,298, filed on Oct. 28, 2009.

(30) Foreign Application Priority Data

Oct. 29, 2008  (JP) ................................. 2008-277802

(51) Int. Cl.
  *H03B 17/00* (2006.01)
  *H03L 7/26* (2006.01)
  *H03L 1/04* (2006.01)
(52) U.S. Cl.
  USPC ................................. 331/94.1; 331/70; 331/3

(58) Field of Classification Search
  USPC ............................ 331/94.1, 3, 70; 372/34, 36
  See application file for complete search history.

(56) References Cited

U.S. PATENT DOCUMENTS

| 5,656,974 | A  | * | 8/1997 | Thomann et al. | ................. 331/3 |
| 6,320,472 | B1 | * | 11/2001 | Vanier | ......................... 331/94.1 |
| 6,806,784 | B2 |  | 10/2004 | Hollberg et al. | |
| 2006/0022761 | A1 | * | 2/2006 | Abeles et al. | ................ 331/94.1 |

FOREIGN PATENT DOCUMENTS

JP    06-120584    4/1994
JP    10-284772    10/1998

* cited by examiner

*Primary Examiner* — Ryan Johnson
(74) *Attorney, Agent, or Firm* — Harness, Dickey & Pierce, P.L.C.

(57)    ABSTRACT

A physical section of an atomic oscillator includes: a gas cell in which gaseous metal atoms are sealed, and the gas cell includes a first window having optical transparency; a light source that emits excitation light toward the metal atoms through the first window; a first heating unit that disposes at the first window and that is located between the first window and the light source; and a Peltier element that is stacked on the first heating unit, that is located between the first heating unit and the light source, and that decreases a temperature of a side of the Peltier element facing the light source than a temperature of an opposite side of the Peltier element facing the gas cell.

10 Claims, 5 Drawing Sheets

PHYSICAL SECTION OF ATOMIC OSCILLATOR

CROSS-REFERENCE TO RELATED APPLICATIONS

This is a continuation application of U.S. Ser. No. 12/607,298 filed Oct. 28, 2009, which claims the priority based on Japanese Patent Application No. 2008-277802 filed on Oct. 29, 2008, the disclosures of which are hereby incorporated by reference in their entireties.

BACKGROUND

1. Technical Field

The present invention relates to a physical section of an atomic oscillator. The physical section is a main part of the atomic oscillator. In particular, the present invention relates to a physical section of a highly-accurate and downsized atomic oscillator in which temperatures of a light source and a gas cell are stabilized.

2. Related Art

Atomic oscillators using alkali metals such as rubidium and cesium need to keep alkali metal atoms in a vapor state with buffer gas in a gas cell when the oscillators use energy transition of the atoms. Therefore, the oscillators operate while maintaining the gas cell, in which the atoms are sealed, at a high temperature. An operating principle of the atomic oscillators is broadly classified into a double resonance method utilizing light exciting alkali metal atoms and microwaves (refer to JP-A-10-284772, as a first example), and a method utilizing quantum interference effect (hereinafter, referred to as coherent population trapping: CPT) produced by two kinds of interfering light (refer to U.S. Pat. No. 6,806,784 B2, as a second example). For example, the atomic oscillator using the CPT according to the second example includes a physical section (an optical system) which is a main part of the atomic oscillator and is composed of a semiconductor laser as a light source, a gas cell, and a light detector as a light detection unit. In the gas cell, alkali metal atoms such as a rubidium atom and a cesium atom that are quantum absorbers are sealed. The semiconductor laser produces two kinds of laser light (coupling light and probe light) having different wavelengths from each other to output the laser light to the gas cell. The atomic oscillator detects how much laser light made incident on the gas cell is absorbed by metal atom gas with the light detector so as to detect atomic resonance, and allows a reference signal of a quartz crystal oscillator and the like to synchronize with the atomic resonance at a control system such as a frequency control circuit, obtaining an output. The light detector is positioned at an opposite side of the side, at which the semiconductor laser is positioned, of the gas cell.

Here, when atomic concentration within the gas cell is varied in the atomic oscillator, a degree of absorption of light to the atomic gas is varied, causing an error of detection of the atomic resonance or an impossibility of detection. Therefore, atomic oscillators that are put into practical use include a heating unit for maintaining vapor of atoms within a gas cell at a constant temperature (80° C., for example) and a temperature controlling system controlling the heating unit. However, as a demand of downsizing an electronic apparatus including an atomic oscillator is increased, the atomic oscillator needs to be downsized. Therefore, the heating unit of the gas cell is also required to be downsized and have a function to maintain the gas cell at a constant temperature.

The aging characteristic of the semiconductor laser extremely deteriorates under a high temperature, whereby the life of the semiconductor laser is shortened. This mainly causes short life of the atomic oscillator and unstable laser light irradiation, thus degrading accuracy of the output frequency of the atomic oscillator. Therefore, the temperature of the semiconductor laser needs to be stabilized by suppressing overheat of the semiconductor laser.

In order to meet such need, U.S. Pat. No. 6,320,472 B1 as a third example and JP-A-6-120584 as a fourth example suggest a physical section of an atomic oscillator which controls temperatures of a light source and the like by using a Peltier element using a Peltier effect by which heat is transferred from one surface to the other surface when direct current is applied.

However, in the physical section of the atomic oscillator in the third example, one surface of a Peltier element is closely attached to a light source to enable temperature control of the light source, but the other surface of the Peltier element is positioned where the other surface does not contribute to the temperature control of the physical section of the atomic oscillator. For example, the other surface of the Peltier element and the gas cell are disposed away from each other, so that the Peltier element hardly contributes to the temperature control of the gas cell. Thus the structure of the physical section of the atomic oscillator does not take advantage of the characteristic of the Peltier element for the temperature control.

In the physical section of the atomic oscillator in the fourth example as well, overheat of a light source is prevented by a heat absorption plate disposed on one surface of a Peltier element, but the other surface of the Peltier element is positioned where the other surface hardly contributes to the temperature control of the physical section of the atomic oscillator. Further, the gas cell is irradiated with light of the light source, of which a temperature is controlled by the Peltier element, through an optical fiber, making hard to downsize the atomic oscillator and increasing a cost of the oscillator.

SUMMARY

An advantage of the present invention is to provide a physical section of a highly-accurate and downsized atomic oscillator of which temperatures of a light source and the like are stabilized.

A physical section of an atomic oscillator according to an aspect of the invention includes at least: a gas cell including a cylindrical portion and first and second windows respectively hermetically-closing openings of both sides of the cylindrical portion to form a cavity in which gaseous metal atoms are sealed; a light reflection unit disposed on the first window; a first heating unit disposed to be closely attached to the second window and heating the gas cell at a predetermined temperature; a light source disposed so as to allow a light emitting part thereof to face the light reflecting unit, emitting excitation light exciting the metal atoms in the gas cell, and provided on a side, which is a reverse side to a side to which the gas cell is provided, of the first heating unit; a light detection unit detecting the excitation light reflected by the light reflection unit and provided also on a side, which is a reverse side to a side to which the gas cell is provided, of the first heating unit; and a Peltier element interposed between the light source and the light detection unit on one side and the first heating unit on the other side.

According to this structure, temperatures of the light source and the light detection unit and a temperature of the gas cell can be effectively controlled by using the Peltier element utilizing a Peltier effect by which heat is transferred from one surface to the other surface when direct current is applied. That is, one surface, of which a temperature is decreased, of the Peltier element is capable of preventing overheat of the light source and stabilizing the temperature of the light detection unit, being able to achieve stabilization of characteristics and long operating lives of the light source and the light detection unit. The other surface, of which a temperature is increased, of the Peltier element suppresses heat loss of the first heating unit so as to improve heating efficiency of the first heating unit for the gas cell. Accordingly, a long-life and reliable atomic oscillator of which the output frequency is stabilized can be provided.

The physical section of an atomic oscillator according to the aspect further includes: an inclination member having two inclined surfaces on which the light source and the light detection unit are respectively disposed. The inclined surfaces form an angle therebetween so as to allow the excitation light emitted from the light source to be reflected by the light reflection unit and be made incident on a light receiving part of the light detection unit.

According to the aspect, in the physical section of an atomic oscillator, the excitation light emitted from the light source and having traveled in the gas cell can be reflected by the light reflection unit and allowed to travel in the gas cell again to be made incident on the light detection unit. The light reflection unit can be relatively easily formed by layering a light reflection film on a surface of the window of the gas cell.

In the physical section of an atomic oscillator according to the aspect, a through hole may be formed on a region, which is to be an optical path of the excitation light that is emitted from the light source and reflected by the light reflection unit to reach the light detection unit, of members free from optical transparency among members on the optical path.

According to the structure, since the optical path of the excitation light can be secured by the through hole, all of the members do not necessarily have optical transparency. Thus choices of materials of the members are increased, providing the physical section of the oscillator composed of the members each having an excellent characteristic.

In the physical section of an atomic oscillator according to the aspect, the first heating unit may be a thin film heater made of a transparent electrode film.

According to the structure, since the first heating unit has optical transparency, a through hole for securing the optical path of the excitation light need not be formed. Thus processing for the first heating unit is not required, so that the processing process of the atomic oscillator is simplified and the processing cost can be reduced.

The physical section of an atomic oscillator according to the aspect further includes a second heating unit provided on the first window.

According to the structure, a first window side can be maintained at a high temperature, being able to prevent a part of alkali metal atoms sealed in the gas cell from being solidified and attaching to an inner surface of the first window.

BRIEF DESCRIPTION OF THE DRAWINGS

The invention will be described with reference to the accompanying drawings, wherein like numbers reference like elements.

DESCRIPTION OF EXEMPLARY EMBODIMENT

A physical section of an atomic oscillator of an embodiment will be described with reference to the accompanying drawings.

Figure 1A:
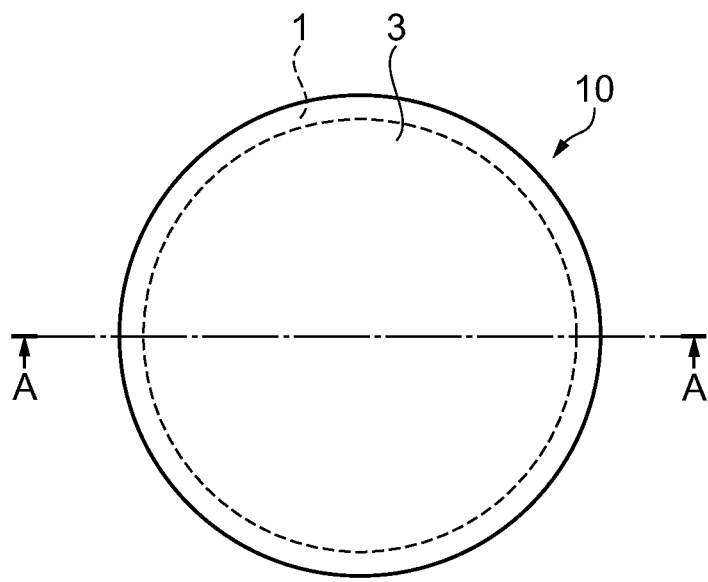
FIG. 1A is a plan view showing a gas cell, viewed from the above, of an atomic oscillator of an embodiment.
Figure 1B:
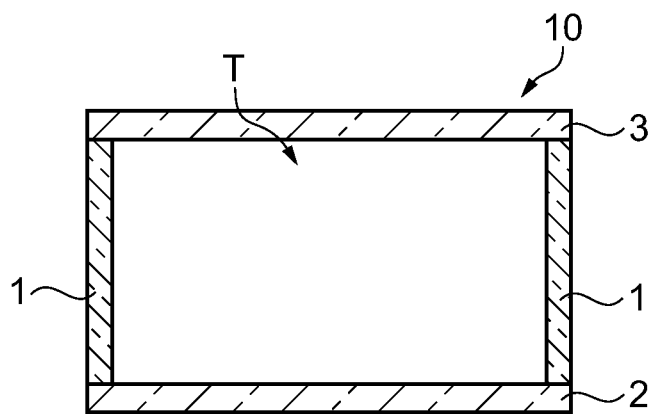
FIG. 1B is a sectional view taken along an A-A line of FIG. 1A.

FIGS. 1A and 1B are diagrams for schematically explaining a gas cell of an atomic oscillator according to the embodiment. FIG. 1A is a plan view, and FIG. 1B is a sectional view taken along the A-A line of FIG. 1A.

Figure 2A:
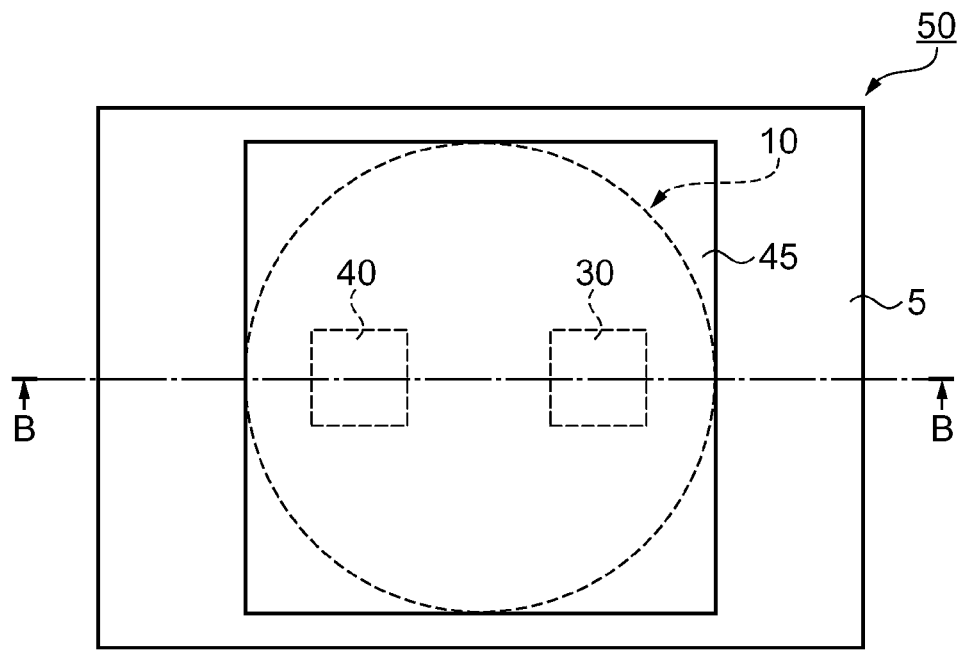
FIG. 2A is a plan view showing a physical section, viewed from the above, of an atomic oscillator of the embodiment.
Figure 2B:
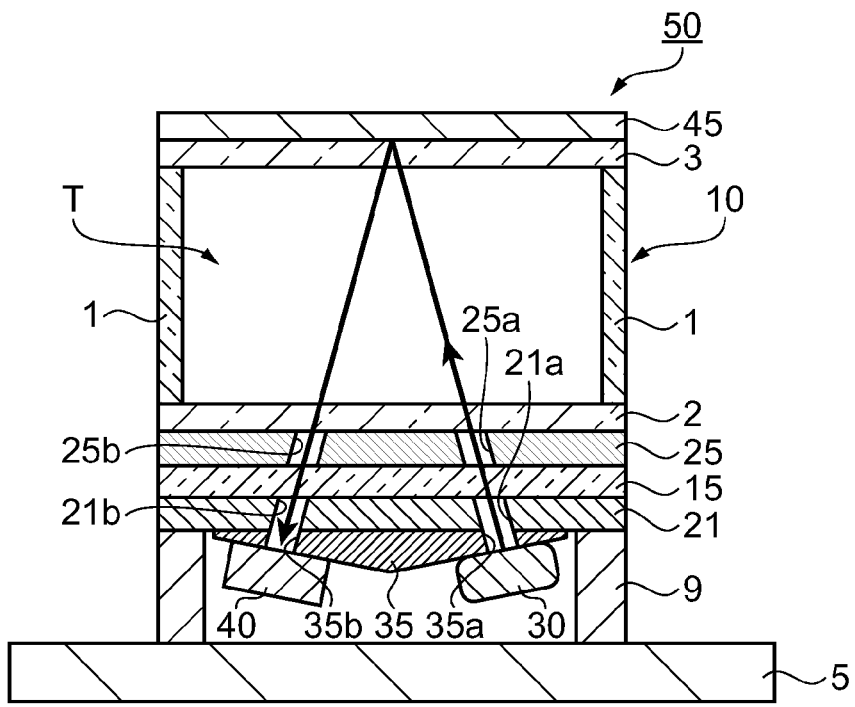
FIG. 2B is a sectional view taken along a B-B line of FIG. 2A.

FIGS. 2A and 2B are diagrams for explaining a physical section of the atomic oscillator according to the embodiment. FIG. 2A is a plane viewed from the above, and FIG. 2B is a sectional view taken along the B-B line of FIG. 2A.

Gas Cell

A gas cell which is a main part of the physical section of the atomic oscillator of the embodiment will be first described. Referring to FIGS. 1A and 1B, this gas cell 10 is composed of a cylindrical portion 1 as a cylindrical part and windows 2 and 3 which seal openings at both ends of the cylindrical portion 1 to form a cavity T1 air-tightly. A great number of metal atoms (not shown) which are obtained by evaporating alkali metal atoms such as rubidium atoms and cesium atoms and serve as quantum absorbers are sealed in the cavity T.

In the gas cell 10 in which metal atomic gas is sealed in its cavity T, the windows 2 and 3 are made of a material having optical transparency such as glass. The windows 2 and 3 constitute an incident surface and an emitting surface of excitation light, which excites the metal atomic gas, in an optical path. On the other hand, the cylindrical portion 1 does not need optical transparency, so that the cylindrical portion 1 may be made of metal or resin, for example. Alternatively, the cylindrical portion 1 may be made of an optical transparent material such as glass which is the same material of that of the windows 2 and 3.

Atomic Oscillator

A physical section of the atomic oscillator including the gas cell 10 described above will now be described. Referring to FIGS. 2A and 2B, a physical section 50 of the atomic oscillator includes: the gas cell 10 described above; a control circuit substrate 5; an inclination member 35; a vertical cavity surface emitting laser (VCSEL) 30 serving as a light source of excitation light; a photo sensor 40 serving as a light detection unit; an optical element layer 15; a heater 25 serving as a first heating unit of the gas cell 10; a light reflection film 45 serving as a light reflection unit of the excitation light from the light source; and a Peltier element 21. The control circuit substrate 5 includes various control circuits for the physical section 50 of the atomic oscillator including a temperature control circuit which is not shown. The Peltier element 21 controls temperatures of the VCSEL 30, the photo sensor 40, and the gas cell 10.

In particular, the heater 25, the optical element layer 15, the Peltier element 21, and the inclination member 35 are layered in this order on an outer surface of the window 2. The window 2 is one window of the gas cell 10 in an optical path direction of the excitation light. The VCSEL 30 and the photo sensor 40 are respectively disposed on one inclined surface and the other inclined surface formed on both sides of the inclination member 35 from the tip portion. Further, the light reflection film 45 is formed on an outer surface of the window 3 which is the other window of the gas cell 10 in the optical path direction of the excitation light.

As shown by an arrow in FIG. 2B, the excitation light emitted from the VCSEL 30 passes through the inclination member 35, the Peltier element 21, the optical element layer 15, and the heater 25 to travel in the gas cell 10 in a direction from the window 2 to the window 3, then the light is reflected by the light reflection film 45, which is provided on the outer surface of the window 3, to return in a direction from the window 3 to the window 2, and the light passes through the window 2, the heater 25, the optical element layer 15, the Peltier element 21, and the inclination member 35 to be made incident on the photo sensor 40. An inclination angle of the inclined surfaces of the inclination member 35 on which the VCSEL 30 and the photo sensor 40 are disposed is set to allow the excitation light emitted from the VCSEL 30 to be reflected at the light reflection film 45 and be made incident on the photo sensor 40. Thus the optical path of the excitation light is lengthened by allowing the excitation light to travel back and forth in the gas cell 10 with the light reflection film 45, being able to secure more distance in which the excitation light travels in the metal atomic gas. Accordingly, the atomic oscillator can be downsized without degrading the accuracy thereof.

On the optical path, shown by the arrow in the drawing, of the excitation light in the physical section 50 of the atomic oscillator, through holes are formed on members having no optical transparency so as to allow the excitation light to pass therethrough. In particular, through holes 35*a* and 35*b*, through holes 21*a* and 21*b*, and through holes 25*a* and 25*b* are formed respectively on regions, to be the optical path of the excitation light, of the inclination member 35, the Peltier element 21, and the heater 25.

The physical section 50 of the atomic oscillator of the embodiment is a main part of the atomic oscillator which controls oscillation frequency by using light absorption property derived from a quantum interference effect appearing when two kinds of light having different wavelengths from each other are made incident as coherent light having coherency on the gas cell 10 in which the metal atomic gas is sealed, that is the oscillator 50 utilizes coherent population trapping (CPT), as described later. Here, the coherent light is light having coherency such as laser light produced by a semiconductor laser. The VCSEL 30 serving as the light source is a kind of the semiconductor laser which is a light source of the coherent light and performs surface emission to be able to produce power-saving light having high intensity.

The photo sensor 40 is composed of a solar cell or a photo diode, for example.

The Peltier element 21 is a semiconductor element using a Peltier effect by which heat is transferred from one surface to the other surface by applying direct current. In the embodiment, the Peltier element 21 maintains and stabilizes temperatures of the VCSEL 30, the photo sensor 40, and the heater 25. The VCSEL 30 and the photo sensor 40 are disposed on one surface of the Peltier element 21 with the inclination member 35 interposed therebetween, and the heater 25 is disposed on the other surface of the Peltier element 21 with the optical element layer 15 interposed therebetween. That is, the one surface, of which a temperature is decreased, of the Peltier element 21 performs heat-absorption to prevent overheat of the VCSEL 30 and stabilizes the temperature of the photo sensor 40, and the other surface, of which a temperature is increased, heats the optical element layer 15 and accordingly suppresses transfer of heat of the heater 25 to the optical element layer 15 so as to improve a heating effect of the heater 25 with respect to the gas cell 10.

In order to make such function of the Peltier element 21 more effective, the inclination member 35 interposed between the Peltier element 21 on one side and the VCSEL 30 and the photo sensor 40 on the other side; and the optical element layer 15 interposed between the Peltier element 21 and the heater 25 are preferably made of a material having a superior heat conductivity. The inclination member 35 may be made of metal such as aluminum, ceramic, or silicon, for example. Further, the optical element layer 15 may be made of a glass substrate on which an optical treatment is performed.

In addition, the optical element layer 15 is an optical layer that performs dispersion in which an unnecessary light component of excitation light is removed and only a necessary light component is transmitted, and adjusts light intensity. A neutral density (ND) filter, a wavelength plate, or a layered body of these is used as the optical element layer 15, for example. Here, the ND filter is a neutral density optical filter that reduces light intensity without changing relative spectral distribution of energy of light emitted from a light source lamp and without showing any spectral selective absorption.

The light reflection film 45 is a total reflection film obtained by depositing aluminum, for example, on the window 3 made of glass, and thus forms a reflection mirror on the window 3.

Operation of Atomic Oscillator

An operating principle of the atomic oscillator according to the embodiment will now be described.

The operating principle of the atomic oscillator is broadly classified into a double resonance method using light exciting alkali metal atoms and micro waves, and a method using quantum interference effect (CPT) produced by two kinds of interfering light. As mentioned above, an example of the operating principle of the atomic oscillator using the CPT is described in the embodiment.

In the physical section 50 of the atomic oscillator shown in FIGS. 2A and 2B, the VCSEL 30 serving as the light source produces two kinds of laser light (coupling light and probe light) having different wavelengths from each other to output the laser light to the gas cell 10. The laser light (excitation light) incident on the gas cell 10 from the VCSEL 30 travels inside the gas cell 10 to be reflected at the light reflection film 45, and again travels inside the gas cell 10 to reach the photo sensor 40. At this time, the atomic oscillator detects how much excitation light which travels back and forth inside the gas cell 10 is absorbed by metal atomic gas sealed in the gas cell 10 with the photo sensor 40 so as to detect atomic resonance, and allows a reference signal of a quartz crystal oscillator and the like to synchronize with the atomic resonance by the control system such as a frequency control circuit which is not shown, obtaining an output.

Figure 3A:
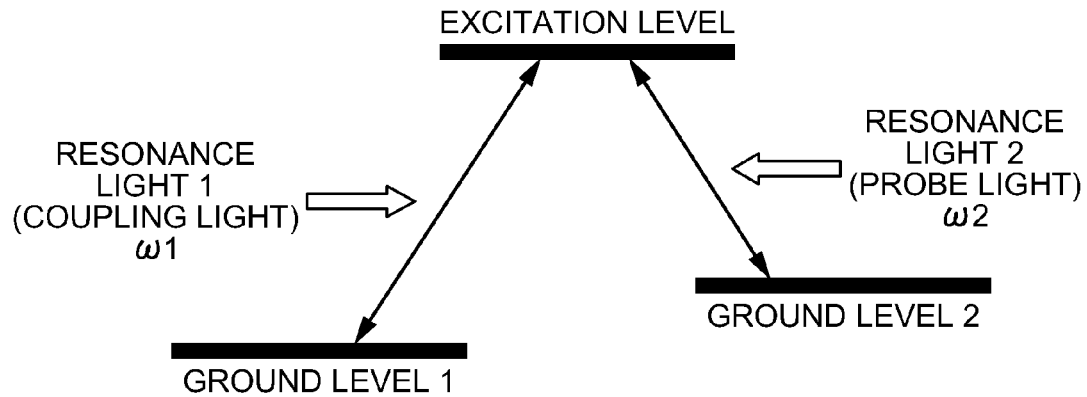
FIG. 3A is an explanatory diagram of energy levels of the atomic oscillator.
Figure 3B:
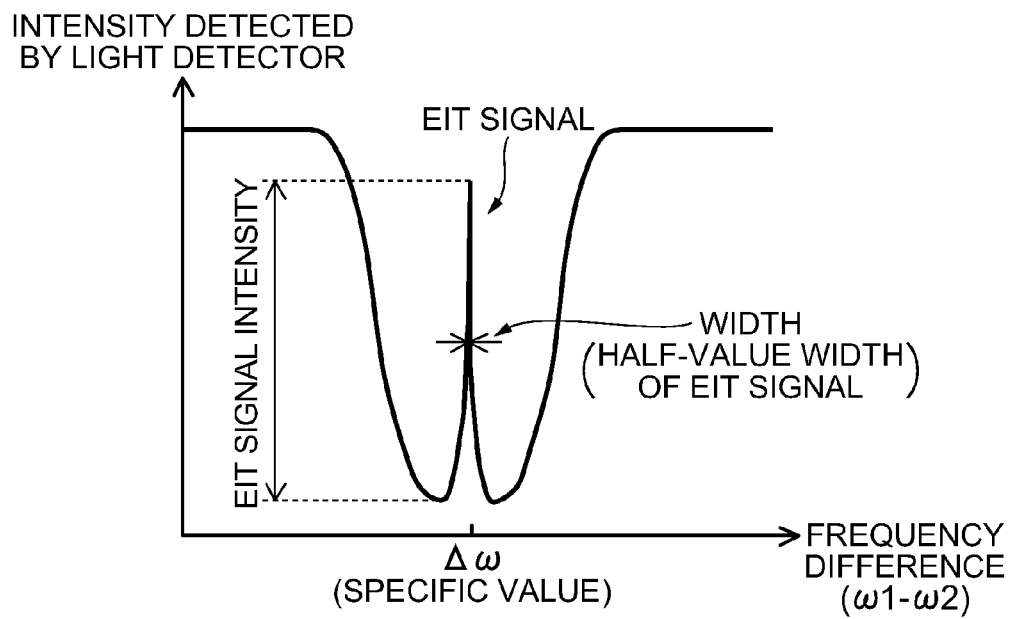
FIG. 3B is an explanatory diagram of light absorption spectrum of the atomic oscillator.

FIG. 3A shows energy levels of the quantum absorbers. The energy levels of the quantum absorbers are expressed by a three-level system ($\Lambda$ type level system, for example) including two ground levels (a ground level 1 and a ground level 2) and an excitation level. When a difference between two frequencies ($\omega 1$ and $\omega 2$) of two beams, which are simultaneously radiated, of the resonance light precisely agrees with an energy difference between the ground level 1 and the ground level 2, the three-level system can be expressed by a coherent state between the ground level 1 and the ground level 2. That is, the excitation to the excitation level is stopped. Namely, as shown in an optical absorption spectrum of FIG. 3B, the quantum absorbers in the gas cell 10 absorb the laser light radiated from the light source (VCSEL 30) and an optical absorption property (transmission) varies depending on frequency difference between the two kinds of light. When the frequency difference between the coupling light and the probe light has a specific value, neither of two kinds of the light is absorbed but transmitted. This phenomenon is known as electromagnetically induced transparency (EIT) phenomenon. The CPT uses the EIT phenomenon so as to detect and use a phenomenon, in which the light absorption is stopped in the gas cell when a wavelength (wavelengths) of one of or both of the two kinds of resonance light is (are) varied, as an EIT signal having a shape like δ function.

According to the physical section 50 of the atomic oscillator of the embodiment, the function of the Peltier element 21 utilizing the Peltier effect by which heat is transferred from one surface to the other surface enables effective temperature control of the VCSEL 30 serving as the light source, the photo sensor 40, and the gas cell 10. That is, the one surface, of which the temperature is decreased, of the Peltier element 21 is capable of preventing the overheat of the VCSEL 30 through the inclination member 35 and stabilizing the temperature of the photo sensor 40, being able to stabilize the characteristics of the VCSEL 30 and the photo sensor 40 and achieving longer operating lives of the VCSEL 30 and the photo sensor 40. Further, the other surface, of which the temperature is increased, of the Peltier element 21 heats the optical element layer 15 so as to suppress transfer of heat of the heater 25 to the optical element layer 15, improving the heating effect of the heater 25 with respect to the gas cell 10. Accordingly, a long-life and reliable atomic oscillator of which the output frequency is stabilized can be provided.

Further, according to the physical section 50 of the atomic oscillator of the embodiment, the gas cell 10 which is desirably heated by the heater 25 can be disposed close to the VCSEL 30 and the photo sensor 40 which should not be heated, by interposing the Peltier element 21 therebetween. Further, in the physical section 50, the excitation light emitted from the VCSEL 30 to the gas cell 10 is reflected by the light reflection film 45, allowing the excitation light to travel back and forth in the cavity of the gas cell 10 in which gaseous metal atoms are sealed. Thus, the optical path of the excitation light traveling inside the gas cell 10 can be kept long. The above-mentioned structure can achieve the downsizing of a long-life and reliable atomic oscillator of which the output frequency is stabilized by the Peltier element 21.

The physical section 50 of the atomic oscillator described in the above embodiment may be modified as follows.

First Modification

In the above embodiment, the VCSEL 30 and the photo sensor 40 are disposed on the inclined surfaces of the inclination member 35. In addition, the inclination angle of the inclined surfaces on which the VCSEL 30 and the photo sensor 40 are disposed is set such that the excitation light emitted from the VCSEL 30 is reflected by the light reflection film 45 and made incident on the photo sensor 40. However, the structure is not limited to this. Such structure that a reflection angle of the excitation light is adjusted by using a plurality of light reflection planes enables arrangement of the VCSEL 30 and the photo sensor 40 on a single plane without using the inclination member.

Figure 4:
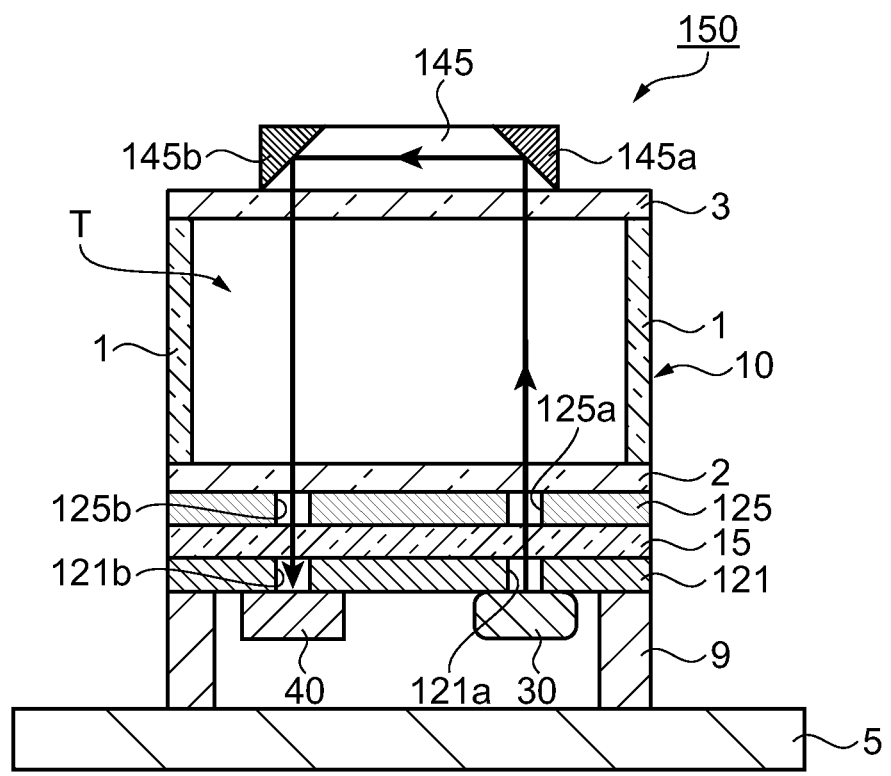
FIG. 4 is a sectional view for explaining a physical section of an atomic oscillator according to a first modification.

FIG. 4 is a sectional view for schematically explaining a physical section of an atomic oscillator using a light reflection section having two light reflection planes. The elements of the atomic oscillator of a first modification that are identical to those of the atomic oscillator of the above embodiment are allotted with the same reference numbers, and descriptions thereof will not be repeated.

Referring to FIG. 4, a physical section 150 of the atomic oscillator of the first modification includes: the gas cell 10, the VCSEL 30, the photo sensor 40, a Peltier element 121, the optical element layer 15, a heater 125, and a light reflection section 145 which are provided on the control circuit substrate 5.

In particular, the heater 125, the optical element layer 15, and the Peltier element 121 are layered in this order on an outer surface of the window 2. The window 2 is one window of the gas cell 10 in an optical path direction of the excitation light. The VCSEL 30 and the photo sensor 40 are disposed on a surface, which is a reverse surface of a surface on which the optical element layer 15 is layered, of the Peltier element 121. Here, between two surfaces of the Peltier element 121 of which a temperature is increased or decreased when direct current is applied thereto, the VCSEL 30 and the photo sensor 40 are directly disposed on one surface of which a temperature is decreased, and the gas cell 10 is disposed at the other surface side, of which a temperature is increased, with the optical element layer 15 interposed therebetween. On the outer surface of the window 3 which is the other window of the gas cell 10 in the optical path direction of the excitation light, the light reflection section 145 having two light reflection planes 145a and 145b is disposed.

As shown by an arrow in FIG. 4, the excitation light emitted from the VCSEL 30 passes through the Peltier element 121, the optical element layer 15, and the heater 125 and travels in the gas cell 10 in a direction from the window 2 to the window 3 to reach one light reflection plane 145a of the light reflection section 145 provided on the outer surface of the window 3. The light reflection plane 145a on which metal film or the like is formed reflects the excitation light. The light reflection plane 145a is formed such that the excitation light which has passed through the gas cell 10 is made incident on the plane 145a by an incident angle of 45 degrees. The excitation light reflected by the light reflection plane 145a is made incident on the other light reflection plane 145b of the light reflection section 145 which is formed such that the excitation light is made incident thereon by an incident angle of 45 degrees. Then the excitation light reflected by the light reflection plane 145b returns in a direction from the window 3 to the window 2 and passes through the window 2, the heater 125, the optical element layer 15, and the Peltier element 121 to be made incident on the photo sensor 40.

On the optical path of the excitation light in the physical section 150 of the atomic oscillator, through holes are formed on members having no optical transparency so as to allow the excitation light to pass therethrough. In particular, through holes 121a and 121b and through holes 125a and 125b are provided respectively on regions, to be the optical path of the excitation light, of the Peltier element 121 and the heater 125.

According to the structure of the physical section 150 of the atomic oscillator of the first modification, between the two surfaces of the Peltier element 121, the VCSEL 30 and the photo sensor 40 are directly disposed on one surface of which the temperature is increased when direct current is applied. Accordingly, the temperature of the VCSEL 30 and the temperature of the photo sensor 40 can be more effectively controlled by the one surface of the Peltier element 121, advantageously achieving a long-life and highly-reliable atomic oscillator of which the output frequency is stabilized.

Second Modification

In the above embodiment and the first modification, the through holes 25a and 25b or the through holes 125a and 125b are formed on the regions, to be the optical path of the excitation light, of the heater 25 or the heater 125 which is one of members having no optical transparency. However, through holes need not be formed by using a heater material having optical transparency.

Figure 5:
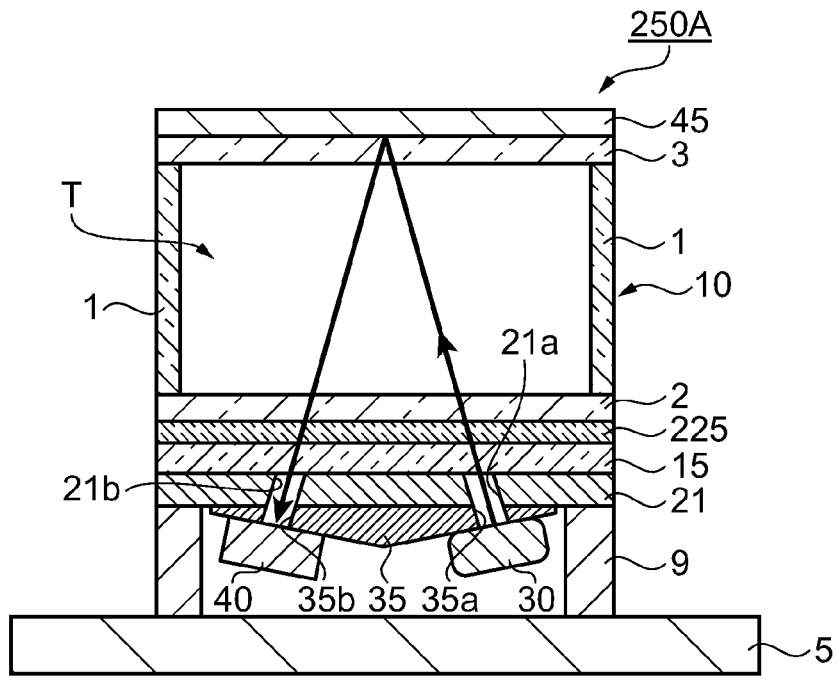
FIG. 5 is a sectional view for explaining a physical section of an atomic oscillator according to a second modification.
Figure 6:
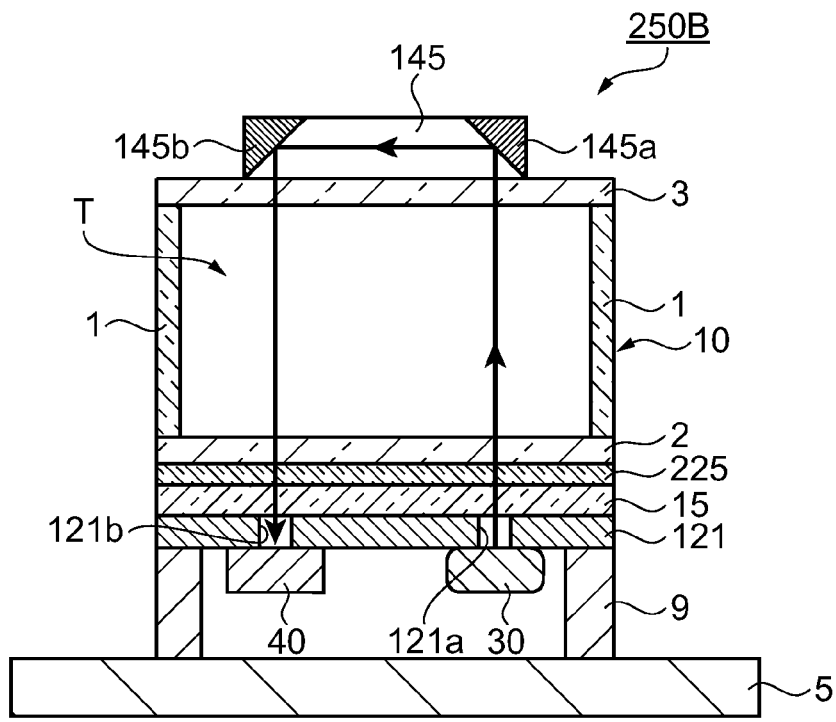
FIG. 6 is a sectional view for explaining a physical section of an atomic oscillator according to the second modification.

FIGS. 5 and 6 are sectional views for schematically explaining a physical section of an atomic oscillator provided with a heater made of a transparent electrode film. FIG. 5 shows a structure using a heater made of a transparent electrode film in the physical section 50 of the atomic oscillator of the above embodiment. FIG. 6 shows a structure using a heater made of a transparent electrode film in the physical section 150 of the atomic oscillator of the first modification. The elements of the atomic oscillator of the present modification (a second modification) that are identical to those of the atomic oscillator of the above embodiment or the first modification are allotted with the same reference numbers, and descriptions thereof will not be repeated.

A physical section 250A of the atomic oscillator shown in FIG. 5 includes: the gas cell 10, the inclination member 35, the VCSEL 30, the photo sensor 40, the Peltier element 21, the optical element layer 15, a transparent electrode heater 225, and the light reflection film 45. The VCSEL 30 and the photo sensor 40 are disposed on the inclination member 35. The transparent electrode heater 225 is made of a transparent electrode film made of indium tin oxide (ITO) or the like and serves as a first heating unit.

In particular, the transparent electrode heater 225, the optical element layer 15, the Peltier element 21, and the inclination member 35 are layered in this order on the outer surface of the window 2. The window 2 is one window of the gas cell 10 in an optical path direction of the excitation light. The VCSEL 30 and the photo sensor 40 are disposed on a surface, which is formed to face a different direction from a surface on which the Peltier element 21 is layered, of the inclination member 35. That is, between two surfaces of the Peltier element 21 of which a temperature is increased or decreased when direct current is applied thereto, the VCSEL 30 and the photo sensor 40 are disposed on one surface, of which a temperature is decreased, with the inclination member 35 interposed therebetween and the gas cell 10 is disposed on the other surface side, of which a temperature is increased, with the optical element layer 15 and the transparent electrode heater 225 interposed therebetween.

In addition, the light reflection film 45 made of a metal film or the like is provided on the outer surface of the window 3 which is the other window of the gas cell 10 in the optical path direction of the excitation light.

On the optical path of the excitation light emitted from the VCSEL 30 and shown by an arrow in FIG. 5, through holes are formed on members having no optical transparency so as to allow the excitation light to pass therethrough. In particular, through holes 35a and 35b and through holes 21a and 21b are formed respectively on regions, to be the optical path of the excitation light, of the inclination member 35 and the Peltier element 21.

According to the structure of the physical sections 250A and 250B of the atomic oscillators of the second modification, compared to the physical sections 50 and 150 of the atomic oscillators of the above embodiment and the first modification, the transparent electrode heater 225 serving as the first heating unit has optical transparency, requiring no through holes for securing the optical path of the excitation light. Thus processing for the first heating unit is not required, so that the processing process of the atomic oscillator is simplified and the processing cost can be reduced.

The embodiment and their modifications of the invention have been hereinbefore described. However, the invention is not limited to the embodiment but may be further modified within the scope of the invention.

For example, in the embodiment and the modifications above, the physical section of the atomic oscillator including the gas cell 10 having the cylindrical portion 1 of which the opening has a circular shape is described. However, the cylindrical portion of the gas cell may have an opening of an oval shape. Further, the cylindrical portion may have a polygonal column shape depending on accuracy required for an atomic oscillator. Alternatively, the cylindrical portion may have such a section in the longitudinal direction thereof that becomes narrow toward both ends from the center of the section, that is, a sectional convex form.

Though the optical element layer 15 is disposed between the VCSEL 30 serving as the light source and the gas cell 10 and between the gas cell 10 and the photo sensor 40 serving as the light detection unit in the embodiment and the modifications above, the optical element layer 15 may not be provided depending on required accuracy and the like required for the atomic oscillator used as a frequency reference.

Though the heaters 25 and 125 are provided on the window 2 of the gas cell 10 in the embodiment and the modifications above, a heater (second heating unit) may be provided also on the window 3.

For example, referring to FIG. 2B, a heater as the second heating unit is interposed between the window 3 and the light reflection film 45. Here, through holes are formed on a part of the heater so as to allow the excitation light to pass therethrough. Needless to say, through holes are not required on a heater having optical transparency. Alternatively, the heater (the second heating unit) may be disposed on the light reflection film 45. By such structure, a window 3 side can be maintained at a relatively high temperature, being able to prevent a part of alkali metal atoms sealed in the gas cell 10 from being agglutinated and attaching to an inner surface of the window 3. That is, when a temperature at the window 3 side is decreased, a part of the alkali metal atoms are agglutinated and attach to the inner surface of the window 3, blocking light transmission to decrease output intensity of the light. Accordingly, the frequency control of the atomic oscillator becomes unstable, disadvantageously degrading the capability of the atomic oscillator. This structure prevents such disadvantage.

Further, the physical sections 50, 150, 250A, and 250B used in the atomic oscillator utilizing the CPT are described in the embodiment and the modifications. However, needless to say, the invention is applicable to an atomic oscillator employing the double resonance method using light from a light source and a microwave.

What is claimed is:
1. A physical section of an atomic oscillator, comprising:
a gas cell in which gaseous metal atoms are sealed, and the gas cell includes a first window having optical transparency;
a light source that emits excitation light toward the metal atoms through the first window;
a first heating unit that is disposed at the first window and that is located between the first window and the light source;
and a Peltier element that is stacked on the first heating unit, that is located between the first heating unit and the light source, and that decreases a temperature of a side of the Peltier element facing the light source more than a temperature of an opposite side of the Peltier element facing the gas cell.

2. The physical section of an atomic oscillator according to claim 1, further comprising:
- the gas cell includes a second window having optical transparency;
- a light reflection unit that is stacked on the second window outside the gas cell and that reflects the excitation light;
- a light detecting unit that detects the excitation light reflected by the light reflecting unit, wherein
- the Peltier element is located between the first heating unit and the light unit.

3. The physical section of an atomic oscillator according to claim 2, further comprising:
- an optical element layer that is located between the first heating unit and the element.

4. The physical section of an atomic oscillator according to claim 2, wherein
- the first heating unit is made of a transparent electrode film.

5. The physical section of an atomic oscillator according to claim 2, further comprising:
- a second heating unit that is disposed at the second window.

6. An atomic oscillator comprising the physical section of an atomic oscillator according to claim 1.

7. An atomic oscillator comprising the physical section of an atomic oscillator according to claim 2.

8. An atomic oscillator comprising the physical section of an atomic oscillator according to claim 3.

9. An atomic oscillator comprising the physical section of an atomic oscillator according to claim 4.

10. An atomic oscillator comprising the physical section of an atomic oscillator according to claim 5.

* * * * *